United States Patent
Takken et al.

(10) Patent No.: US 10,321,564 B2
(45) Date of Patent: Jun. 11, 2019

(54) SOLDER ASSEMBLY OF PINS TO THE PERIPHERAL END FACE OF A PRINTED CIRCUIT BOARD

(71) Applicant: International Business Machines Corporation, Armonk, NY (US)

(72) Inventors: Todd E. Takken, Brewster, NY (US); Xin Zhang, Yorktown Heights, NY (US); Yuan Yao, Tarrytown, NY (US); Andrew Ferencz, Southborough, MA (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 15/808,786

(22) Filed: Nov. 9, 2017

(65) Prior Publication Data

US 2019/0141829 A1    May 9, 2019

(51) Int. Cl.
*H05K 1/02* (2006.01)
*H05K 1/11* (2006.01)

(52) U.S. Cl.
CPC ......... *H05K 1/0298* (2013.01); *H05K 1/0203* (2013.01); *H05K 1/113* (2013.01)

(58) Field of Classification Search
CPC ....... H05K 1/0298; H05K 1/111; H05K 1/117
See application file for complete search history.

(56) References Cited

U.S. PATENT DOCUMENTS

| 3,398,232 | A | 8/1968 | Hoffman |
| 3,492,538 | A | 1/1970 | Fergusson |
| 3,530,422 | A | 9/1970 | Goodman |
| 5,136,471 | A | 8/1992 | Inasaka |
| 5,451,815 | A | 9/1995 | Taniguchi et al. |
| 5,471,368 | A | 11/1995 | Downie et al. |
| 5,545,924 | A | 8/1996 | Contolastis et al. |
| 5,581,877 | A | 12/1996 | Woychik et al. |
| 5,668,409 | A | 9/1997 | Gaul |
| 6,111,205 | A | 8/2000 | Leddige et al. |
| 6,185,108 | B1 | 2/2001 | Okura et al. |

(Continued)

OTHER PUBLICATIONS

List of IBM Patents or Patent Applications Treated as Related.

(Continued)

*Primary Examiner* — Hoa C Nguyen
(74) *Attorney, Agent, or Firm* — Scully, Scott, Murphy & Presser, P.C.; Daniel Morris, Esq.

(57) ABSTRACT

A printed circuit board (PCB) and PCB assembly. The PCB is formed of a laminate substrate of at least two layers of a non-conductive material forming at least one peripheral end face (PEF) surface separating top and bottom PCB surfaces. Embedded conductive wiring at one or more multiple layers carry energy to or from PCB surface mounted devices. The conductive wiring provides multiple conductive wire ends exposed at multiple locations along the PEF. A conductive contact structure is formed at the PEF surface to connect with one or more of the exposed conductive wire ends. One or more conductive pins are attached to the conductive contact at the PEF and are configured to mount the PCB on, and in a vertical and perpendicular orientation or a coplanar orientation relative to, a surface of a second PCB surface. The conductive pins provide one or more of: an electrical, thermal and/or mechanical contact.

20 Claims, 7 Drawing Sheets

(56) References Cited

U.S. PATENT DOCUMENTS

| | | | |
|---|---|---|---|
| 6,235,551 B1 | 5/2001 | Farnworth et al. | |
| 6,246,016 B1 | 6/2001 | Roessler et al. | |
| 6,265,952 B1* | 7/2001 | Kan | H05K 1/0246 |
| | | | 333/33 |
| 6,345,989 B1 | 2/2002 | Mason et al. | |
| 6,554,654 B1 | 4/2003 | Stoddard et al. | |
| 6,710,266 B2 | 3/2004 | Mix et al. | |
| 6,784,372 B1 | 8/2004 | Yuen et al. | |
| 6,800,942 B1 | 10/2004 | Kinsman | |
| 6,815,614 B1 | 11/2004 | Keating et al. | |
| 6,930,893 B2 | 8/2005 | Vinciarelli | |
| 6,986,682 B1 | 1/2006 | Jeon | |
| 7,180,397 B1 | 2/2007 | Busletta et al. | |
| 7,420,262 B2 | 9/2008 | Bauer et al. | |
| 7,534,966 B2 | 5/2009 | Cho | |
| 7,753,688 B1 | 7/2010 | Everson et al. | |
| 8,283,790 B2* | 10/2012 | Tsou | H01L 23/49555 |
| | | | 257/668 |
| 8,344,842 B1 | 1/2013 | Luzanov | |
| 8,572,841 B2 | 11/2013 | Pedersen et al. | |
| 9,173,292 B1 | 10/2015 | Sokol et al. | |
| 9,468,103 B2 | 10/2016 | Isom et al. | |
| 9,826,639 B2 | 11/2017 | Denda et al. | |
| 2004/0190272 A1 | 9/2004 | Takagi et al. | |
| 2004/0207049 A1 | 10/2004 | Bauer et al. | |
| 2004/0222016 A1 | 11/2004 | Choi et al. | |
| 2006/0012048 A1 | 1/2006 | Murai et al. | |
| 2008/0015443 A1 | 1/2008 | Hosono et al. | |
| 2008/0066953 A1 | 3/2008 | Kanai | |
| 2008/0083984 A1 | 4/2008 | Kagawa | |
| 2008/0266824 A1* | 10/2008 | Wang | H05K 1/111 |
| | | | 361/767 |
| 2009/0283299 A1 | 11/2009 | Suzuki | |
| 2009/0322620 A1 | 12/2009 | Pedersen et al. | |
| 2010/0307798 A1 | 12/2010 | Izadian | |
| 2011/0079912 A1* | 4/2011 | Marcoux | H01L 23/481 |
| | | | 257/773 |
| 2013/0092428 A1 | 4/2013 | Kawaguchi et al. | |
| 2014/0160681 A1* | 6/2014 | Chen | H01R 12/721 |
| | | | 361/704 |
| 2015/0282317 A1 | 10/2015 | Gonya et al. | |
| 2016/0028926 A1 | 1/2016 | Ichimura et al. | |
| 2016/0278209 A1* | 9/2016 | Perez-Uria | H01R 4/024 |
| 2016/0353572 A1 | 12/2016 | Lim et al. | |
| 2017/0256874 A1 | 9/2017 | Abel et al. | |

OTHER PUBLICATIONS

Hermann et al., "Vertically Mounted Module", IP.com Prior Art Database Technical Disclosure, IPCOM000043327D, original publication date: Aug. 1, 1984, Room Electronic Publication Date: Feb. 4, 2005, 3 pages.

Anonymous, "Method to create a contact on the edge of a flip-chip IC package", IP.com Prior Art Database Technical Disclosure, IPCOM000020155D, IP.com Electronic Publication Date: Oct. 29, 2003, 5 pages.

Anonymous, "Disclosed is a method for a direct solder attachment of two or more printed circuit boards without a connector", IP.com Prior Art Database Technical Disclosure, IPCOM000006858D, IP.com Electronic Publication Date: Feb. 6, 2002, 3 pages.

Anonymous, "Method for the direct solder attachment of two or more printed circuit boards without a connector using top-side soldering", IP.com Prior Art Database Technical Disclosure, IPCOM000008067D, IP.com Electronic Publication Date: May 15, 2002, 3 pages.

* cited by examiner

SOLDER ASSEMBLY OF PINS TO THE PERIPHERAL END FACE OF A PRINTED CIRCUIT BOARD

STATEMENT REGARDING FEDERALLY SPONSORED RESEARCH OR DEVELOPMENT

This invention was made with Government support under Contract No.: B621073 awarded by Department of Energy. The Government has certain rights in this invention.

FIELD

The present invention generally relates to printed circuit boards, a printed circuit board assembly and methods of manufacturing and assembling a printed circuit board.

BACKGROUND

Printed circuit boards (PCBs) are laminate structures of a non-conductive substrate having traces or conductive pathways embedded as metallic insertions, e.g., wires, foils or sheets in substrate layers designed for carrying electrical signals or electric power to/from mechanical and/or electronic devices mounted on a surface thereon.

A PCB assembly process includes the connecting of the electronic components with the wirings of printed circuit boards. Typically, there are situated traces or conductive pathways having connections at the surface to which various mechanical or electrical or electronic devices are connected.

A PCB assembly usually includes pads on the top and bottom surfaces for use as contacts to components or other printed circuit boards. In some cases, PCBs have a plated surface edge to permit direct soldering to other circuit boards. However, when it is required to have one PCB mounted to another PCB, pins are commonly used in the circuit assembly. Traditionally, pins are attached to contact pads on the top or bottom surface of the PCB. Vias then anchor the outer layer pads to internal layer metal structures to provide improved mechanical robustness and electrical conductivity.

The attaching of contact pins to the outer top or bottom surfaces of a PCB consumes area on many or all layers of the board.

SUMMARY

A printed circuit board structure and method of assembling PCBs is provided wherein the PCB includes a conductive contact structure on a peripheral end face of a first PCB, and a conductive pin(s) solder attached to the edge. By having the conductive edge, it is possible to make mechanical, electrical and/or thermal contact to a PCB through the edge, without consuming any of the top and bottom surface area of the board nor using significant lateral area on any layers of the PCB. Moreover, the conductive contact edges have higher electrical and thermal conductivity, lower parasitic resistance and inductance. A first PCB having attached pins to the conductive contact structure of one or more PEFs permits mounting to a surface of a second structure, e.g., a second PCB in multiple orientations.

In one aspect, there is provided a printed circuit board (PCB). The PCB includes a laminate substrate having multiple layers of a non-conductive substrate material forming top and bottom areal main faces (AMF) (surfaces) and forming at least one peripheral end face (PEF) separating the top and bottom AMFs, the PEF defining a surface transverse to the top or bottom AMF. The PCB further includes conductive wiring at one or more the multiple layers embedded within the substrate, the conductive wiring adapted for carrying electrical or power signals to or from first PCB surface mounted devices, the embedded conductive wiring at the multiple layers includes multiple conductive wire ends exposed at multiple locations along the PEF. A conductive contact structure is connected to the PEF surface and in contact with one or more of the multiple exposed conductive wire ends. One or more conductive pins are attached to the conductive contact structure at the PEF.

In embodiments, the one or more conductive pins of the PCB assembly provide a mechanical, electrical and/or thermal contact.

In a further aspect, there is provided a printed circuit board assembly. The PCB assembly includes: a first printed circuit board (PCB) having top and bottom areal main faces (AMF) and a peripheral end face (PEF) of predetermined width separating the top and bottom AMF. The second PCB has at least a top AMF. The first PCB comprises: a laminate substrate; and conductive wiring at one or more the multiple layers embedded within the substrate, the conductive wiring adapted for connection to various PCB AMF mounted devices, the embedded conductive wiring at the multiple layers includes multiple conductive wire ends exposed at multiple locations along the first PEF. The first PCB further includes a conductive contact structure connected to the PEF surface and in contact with one or more of the exposed conductive wire ends; and one or more conductive pins of a polygonal structure having bottom and opposing planar contact surfaces, one planar contact surface of the conductive pins attached to the conductive contact structure at the PEF and the pin extending from the PEF surface in a substantially perpendicular orientation relative to a top or bottom AMF of the first PCB. An opposing planar contact surface of one or more the pins of polygonal structure is adapted for surface mounting the first PCB on corresponding one or more conductive contacts on an AMF of a second PCB to form a mounted PCB assembly, the PCB mounted in a substantially perpendicular orientation relative to the surface of the second PCB with the PEF of the first PCB facing the AMF of the second PCB.

The one or more conductive pins of the PCB assembly provide an mechanical, electrical and/or thermal contact for the PCB assembly.

In a further aspect, in the PCB assembly each the one or more attached conductive pin polygonal structures further includes an additional foot portion providing a bottom planar contact surface, wherein a bottom planar contact surface of the foot portion of the one or more attached conductive pin structures is adapted for surface mounting the PCB on corresponding one or more conductive contacts formed on surface of a second PCB to form a PCB assembly in which the first PCB is mounted in a substantially coplanar orientation relative to the surface of the second PCB.

DETAILED DESCRIPTION

Figure 7:
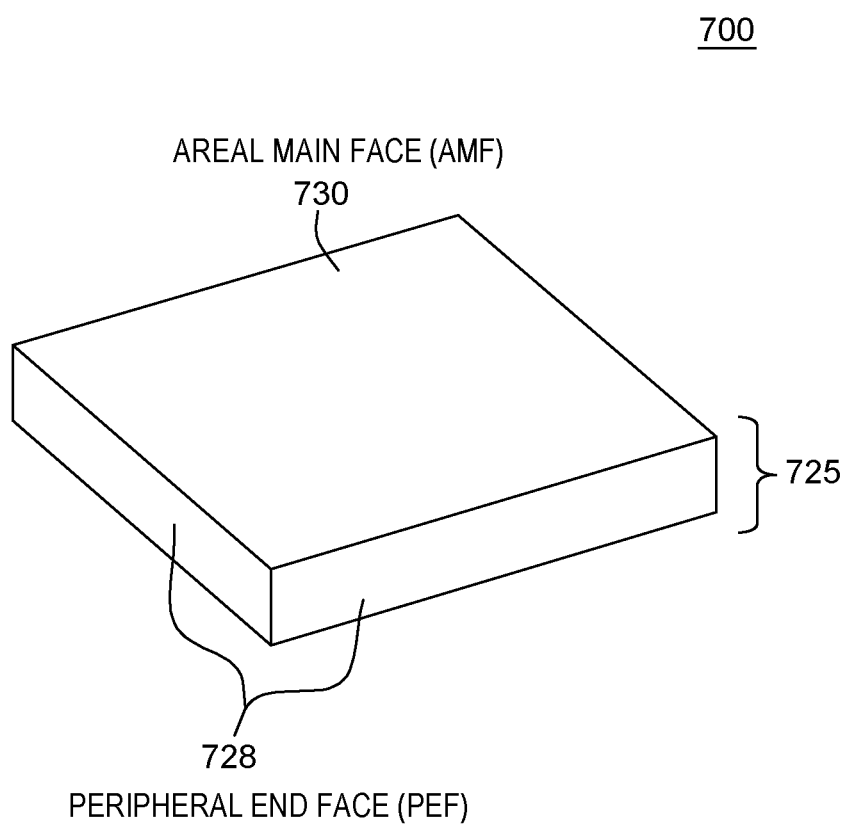
FIG. 7 relates to a printed circuit board structure having a peripheral end face (PEF) surface and areal main face (AMF) surfaces.

As shown in FIG. 7, the embodiments described herein relate to a polygonal, e.g., square or rectangular or oblong printed circuit board (PCB) structure 700 having peripheral end face (PEF) surfaces 728 and areal main face (AMF), i.e., top or bottom surfaces 730. In the embodiments described herein, the PEF 728 of a PCB is of predetermined surface width separating top and bottom AMF surfaces 730. The AMF 730 has a larger area than the remaining four PEF faces 728. In described embodiments, the PCB structure may be a laminate of one or more layers of printed circuit (dielectric) substrate material in which each substrate layer is an insulating dielectric material between layers of copper wiring or, layers of a copper foil or sheeting. Laminate types include multilayer, prepreg, cored, hollow cored. Multilayer laminate materials, may include, but are not limited to: one or more plys of glass, fiberglass, a plastic, Teflon, or a fabric or other insulating material having embedded conductive structures in a laminate structure. A common type of PCB substrate is FR-4, which is a fiberglass-epoxy laminate.

In one embodiment, a width or thickness 725 of the PEF surface may range from between 0.0 2 inches and 0.125 inches although larger PCB thicknesses are contemplated. In one embodiment, a larger PEF surface thickness of up to 0.125 inches may include multiple layers, e.g., two, four, six, eight or ten dielectric layers each with a corresponding inner layer of conductor wiring or foil, e.g., of 0.5, 1.0 or 2 ounce of Copper. In one embodiment, a thickness of a conductive Copper layer may be 15 microns or thicker, e.g., multiples of 10×-100× thereof, and defines an electrical and/or thermal contact edge thickness.

In one embodiment, there is also provided a surface mount assembly of PCBs and method of mounting a peripheral end face (PEF) of a first PCB to a structure, e.g., a second PCB using multiple pins for making electrical and/or thermal contact with like electrical and/or thermal contacts. For example, the first PCB may be mounted and fixedly attached to an areal main face (AMF) of the second PCB. In an embodiment, the first PCB includes a conductive contact structure on one or more PEF surfaces of the PCB and an assembly of one or more pins solder attached to the conductive contact structure at the PEF, each pin configured to provide a separate electrical and/or thermal contact along the length of the PEF surface of the first PCB. The second structure, e.g., an AMF of a second PCB, has one or more conductive features (e.g., conductive pads) exposed at surface locations thereof corresponding to locations of the separate electrical pin contacts. Electrically/thermally conductive surface mount material is disposed on the one or more exposed conductive pads at the AMF of the second PCB and/or corresponding underside surface of each of the multiple electrical pins extending from the PEF of the first PCB. The soldered attachment of the pins enables the stable mounting of the first PCB to the AMF of the second PCB in a perpendicular or coplanar orientation relative to the second PCB.

In an embodiment, the PCB includes a conductive contact formed on one or more PEF (surfaces) of a first PCB, and one or more pins solder attached to the conductive contact. By having the conductive contact structure, it is possible to make direct electrical and/or thermal contact to a PCB through the PEF edge, thereby not using significant lateral surface area on any layers of the PCB. Moreover, the conductive contact structures have higher electrical and thermal conductivity, and lower parasitic resistance and inductance. This first PCB can be mounted to a second structure, e.g., the second PCB, in either a coplanar or a perpendicular orientation relative to the AMF of the second PCB.

Figure 1A:
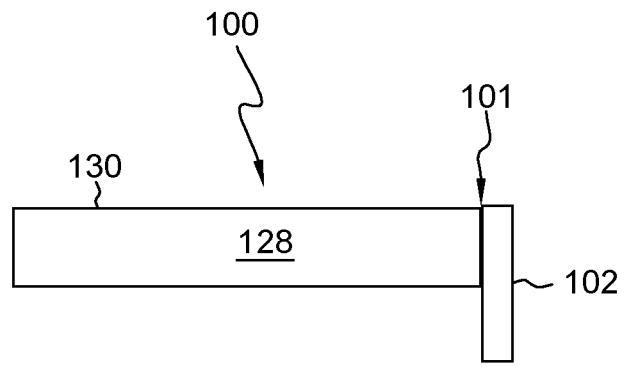
FIGS. 1A-1B are alternate views of an exemplary PCB design according to a first embodiment.

FIG. 1A shows a side view of a PCB 100 (PCB) having at least one PEF surface 128 of the PCB and shown having a conductive edge contact 101 on a PEF surface to which is solder attached a conductive pin 102 extending perpendicular from the PEF surface 128 and extending beyond the plane of bottom surface 130 of the PCB 100. As shown in the perspective view of FIG. 1B, there may be multiple individual conductive contacts 101 to which corresponding individual conductor pins, e.g., pins 102, 104, 106, 108, are connected. Alternately, there may be a single conductive edge contact formed on the PEF 128 with multiple pins extending therefrom that will each be electrically shorted.

Figure 1B:
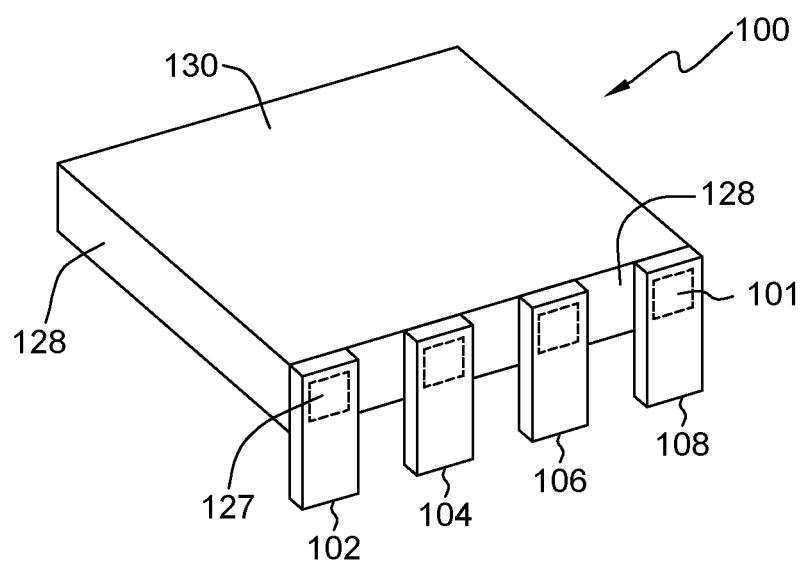

In one embodiment, as shown in FIG. 1B, printed circuit board 100 includes planar AMF surface 130 and PEF surface 128 where the faces 130 and 128 are all oriented with right angles to each other. In FIG. 1B, the peripheral PEF surface 128 is shown including pins 102, 104, 106 and 108 that are each attached to a respective conductive contact 101 shown in broken line. The conductive contact structure 101 is electrically/thermally connected to an embedded conductor pathway, foil, sheet or trace via a corresponding conductive end portion(s) 127 brought out to a surface of the PEF of the PCB 100 for contacting the respective contact 101.

In the embodiment shown in FIGS. 1A, 1B, conductive pins 102, 104, 106 and 108 are straight pins, of a unitary design, and may be polygonal shaped, e.g., rectangular, triangular, or even have rounded or curved edges, or be a round shaped pin. In one embodiment, the conductive contact 101 includes a solder layer for attaching the conductive pins. In one embodiment, the pins may be copper or zinc plated aluminum. An example rectangular conductive pin may be ½ mm wide (e.g., at a 1 mm pitch design) and 0.25 mm thick A pin for carrying more current may be 5 mm wide and 1 mm thick.

In one embodiment, the attaching of pins to the edge of the circuit board permits multiple orientations between different circuit boards. The contact plating 101 of the PEF surface of the PCB and attachment of pins 102 to the edge by solder material permits connections through these pins between multiple circuit boards.

Figure 2A:
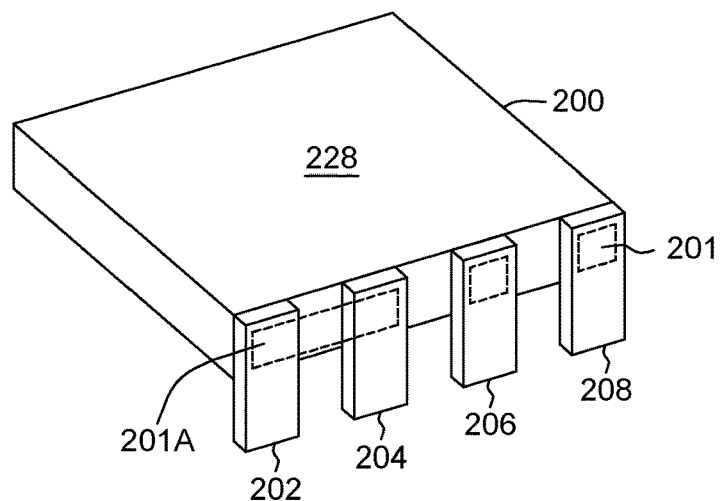
FIGS. 2A-2B are alternate views showing a PCB having solder attached pins to a PEF surface of the PCB through a respective individual conductive contact structures.

FIG. 2A shows a perspective view of a PCB 200 and having pins 202, 204, 206, 208 solder attached to a PEF 228 of the PCB 200 through a single or respective individual conductive contact(s) structure 201. This structure optionally includes a conductive plated contact, e.g., copper, formed by a copper plating process. It is understood that a single conductive contact structure 201A at the PEF surface 228 may span across and electrically connect to many electrically and/or thermally conductive pins.

Figure 2B:
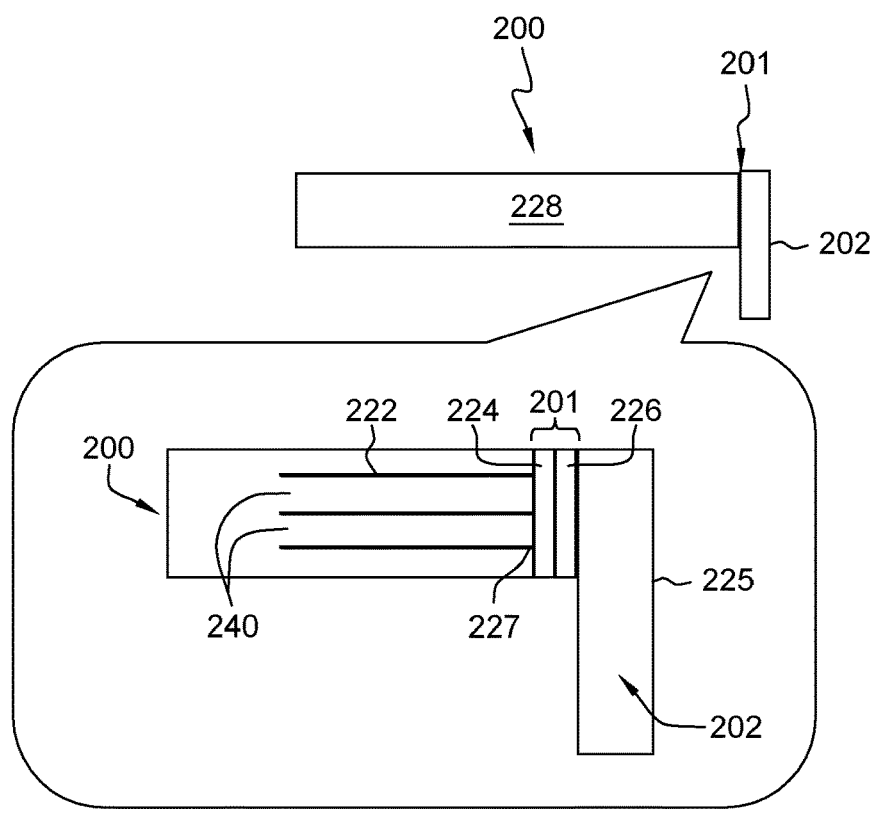

In a cross-sectional view shown in FIG. 2B, the conductive contact structure 201 at the PEF 228 includes a first optional plated layer 224 of conductive material formed flush against the PEF 228, and an attachment interface layer 226 formed flush against the optional conductive plated layer 224 to which a depending pin(s) 202 is attached. In one embodiment, the optional conductive plated layer 224 of contact 201 may be a plate or sheet of copper formed on the PEF 128 using conventionally known metal electro-plating techniques. The optional plated copper layer 224 may range from between 0.001 in.-0.002 in. Conductive plated layer 224 material may alternatively be zinc-plated aluminum or chromium-plated gold.

In one embodiment, the conductive plated layer 224 is optional as the PEF interface layer and a sole conductive contact interface layer, e.g., solder material layer 226, may be provided to attach the(s) pin directly to the exposed conductor wire end at the PEF 228. The conductive contact structure 226 may be an attachment layer of solder. In one example, the thickness of solder layer 226 may range between 1 mil-10 mils depending upon the size of the pin. As a pin may be attached to the PEF by brazing, a conductive contact structure 226 may be a braze material or alloy. One or more of contact material layers 224, 226 may be an electrical and/or thermal conductive contact material.

In the embodiments herein, the conductive pins are attached to a PEF, in a same manner as, and using the same equipment implementing surface mount solder assembly attachment procedure for solder attaching other components to an AMF of a PCB. During the manufacturing of the PCB, the one or more conductive pins are solder-attached to the PEF of the PCB during a same surface mount solder assembly procedure conducted at the same time other components are being mounted/attached to the AMF of the PCB using well know PCB surface mount assembly equipment. Slight modification to a solder stencil of the assembly equipment to extend beyond the PEF edge of the PCB may be implemented to ensure precise solder placement at and over a circumference of the AMF so it would cover the PEF prior to or at the time of pin attachment.

As further shown in the cross-sectional view of FIG. 2B, the PCB 200 is a rigid printed circuit board having printed circuit materials including conductive traces and pathways 222, e.g., multiple layers of copper wires, for conducting electrical power or electronic signals or thermal energy to or from various electrical or mechanical devices at or on the AMF. The electrical devices may include chips, power supplies, and passive electrical and active electronic devices. The PCB board 200 may be rigid and formed as a laminate of one or more layers 240 of printed circuit (dielectric) substrate material in which each substrate layer is an insulating dielectric material between layers of copper wiring (or conductive layers of a copper foil or sheeting) 222. In one embodiment, a conductive wire 222 carrying electrical power signals may be 1/10 of millimeter thick for carrying larger current in the PCB 200, while electronic signals may be carried on thinner copper layers of reduced thickness.

In one embodiment, the PCB 200 is designed such that multiple conductive wires 222, e.g., copper wiring at one or more layers, have corresponding ends 227 brought out to the edge of the PEF surface 228 such that the copper layers 222 become exposed at the PEF 228. The conductive contact structure 201 layer is then formed on the PEF 228 such that it electrically connects with the exposed end 227 of the embedded copper layer 222. For example, one or more pins 202, 204, 206 and 208 may then be directly solder attached 226 to the PEF at a location of an exposed end, or optionally solder attached or brazed to a contact plate(s) 224.

As shown in FIGS. 2A and 2B, pins 202, 204, 206, 208, may be rectangular shaped pins having straight planar surface the define a contact portion 225 capable of being solder attached to a second PCB in a PCB assembly. In other embodiments, the pins may be of a unitary structure and also may have a curved portion and a foot extremity. The feet of these curved pins have an underside capable of being solder attached to a second PCB. The solder attachment of the pins to the PCB is low resistance and permits high current flow to device of the PCB.

In one example, a distance or pitch between any two adjacent pins attached to the PEF may range between 0.5 mm-5 mm, however this pitch range may be expanded depending upon the design.

In one embodiment, the one or more attached conductive pins are adapted to make one or combinations of: thermal, electrical and mechanical contact with another location or device on the same PCB, or make such contact to another structure such as an AMF of a second PCB. FIGS. 3A-3B, 4A-4B, 5A-5B, and 6A-6B show various PCB mounted assemblies where the pin contacts of a first PCB are solder attached to corresponding contacts at a surface of a second PCB in coplanar and perpendicular orientations.

In other embodiments, the attached conductive pins are adapted to make one or more of: thermal, electrical and mechanical contact with a separable mating interface device. That is, a PCB may be have PEF-mounted conductive pins configured for insertion within or mounting into a mating interface device such as a socket, land grid array, or pin grid array.

Figure 3A:
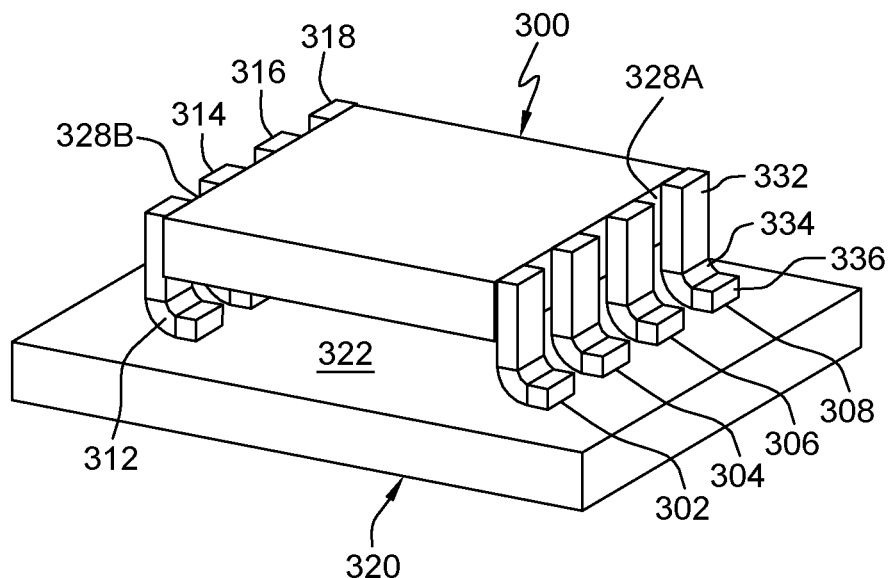
FIGS. 3A-3B depict a first embodiment of a PCB assembly showing a first PCB 300 laterally mounted on a second PCB 320 in a coplanar orientation relative thereto.

A further embodiment shown in FIG. 3A depicts a perspective view of a PCB 300 having curved pins 302, 304, 306, 308, attached to and depending from a first PEF surface 328A and curved pins 312, 314, 316 and 318 attached to and depending from another PEF surface, such as an opposing PEF surface 328B of the PCB 300. Each pin 302, 304, 306, 308, 312, 314, 316 and 318 is solder attached to a respective individual conductive contact structure 301 as in the embodiment shown in FIG. 2. In the embodiment depicted in FIG. 3A, PCB 300 is configured as mounted on a second structure, e.g., a second PCB 320 and coplanar relative to the top or bottom AMF of the second PCB 320.

In particular, as shown in FIG. 3A, each pin 302, 304, 306, 308, 312, 314, 316 and 318 includes a first straight portion 332 attached to the contact solder material layer and/or copper plate, an intermediate curved portion 334 and a foot portion 336, with the underside of the feet portions of these pins configurable for solder attachment to a surface of a second PCB 320. In one embodiment, each of these portions 332, 334,336 may be an integral, unitary conductive structure or are segmented attached portions. The solder attachment of the pins to the PCB is low resistance and permits high current flow to devices of the PCB.

Figure 3B:
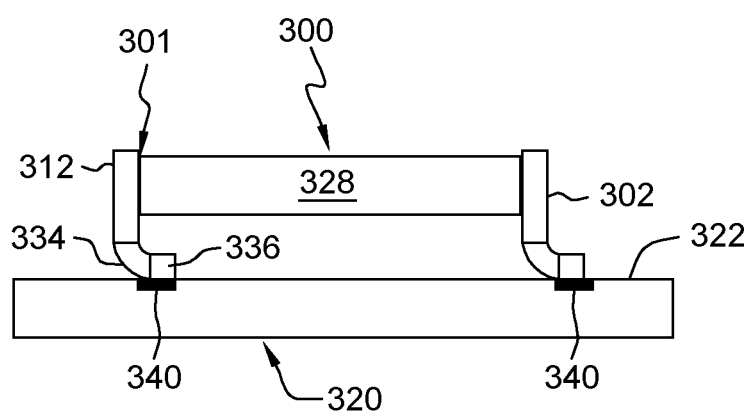

FIGS. 3A and 3B shows a PCB assembly of a first embodiment including the PCB 300 corresponding to the structure of FIG. 3A wherein foot portions 336 of respective pins are solder mounted on corresponding located conductive contacts 340 on a top AMF such that the PCB 300 is mounted in a coplanar orientation relative to the AMF of second PCB 320. The solder attached pins 312, 314, 316, 318 have curved portions that are oriented to bend inwards, i.e., the bottom surface of the feet 336 of curved pins 312, 314, 316, 318 are connected at corresponding contact pads or connectors 340 at a top surface of the second PCB 320 located underneath of the first PCB 300 when assembled, and pins 302, 304, 306, 308 are oriented to bend outwards, i.e., the bottom surface of the feet 336 of curved pins 302, 304, 306, 308 are connected at corresponding exposed contact pads or connectors 340 at a top surface of the second PCB 320 at locations not underneath the PCB 300 when assembled.

Figure 4A:
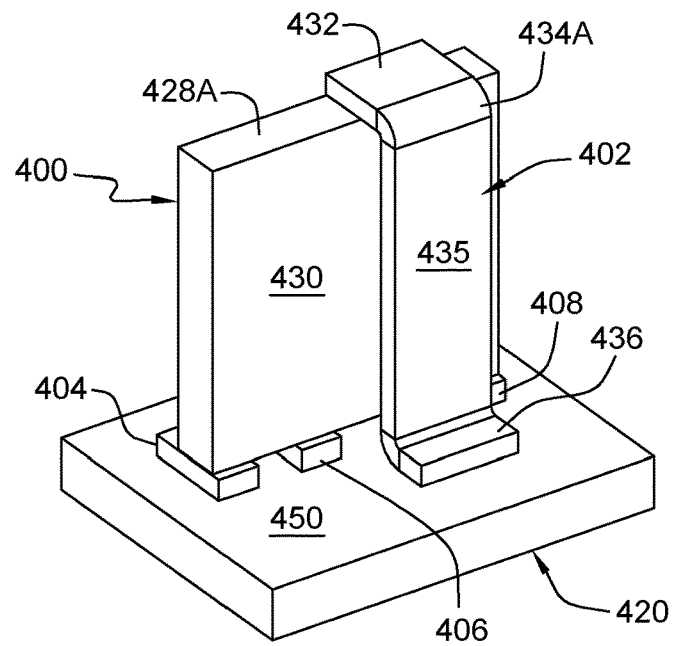
FIGS. 4A-4B depict a further embodiment of a PCB assembly showing a first PCB vertically mounted on a second PCB in a perpendicular orientation relative thereto.

As mentioned, a first PCB may be mounted on and perpendicular relative to a second PCB. FIG. 4A depicts a further embodiment of a PCB assembly showing a perspective view of a first PCB 400 vertically mounted on an AMF of a second PCB 420 in a perpendicular orientation relative thereto. PCB 400 includes straight pins 404, 406,408, attached to a first PEF 428 that faces opposed top surface 450 of the second PCB 420. The straight pins 404, 406, 408 are solder attached to one or more respective individual conductive contact structures of the PEF 428 of PCB 400 as in other embodiments. In the embodiment shown, the planar external contact surface of the pins 404, 406, 408 are solder attached to corresponding respective individual exposed contacts 440 disposed at the AMF surface 450 of the PCB 420.

In embodiment, conductive pins may be solder attached to any PEF surface of the PCB. In the vertical, perpendicularly mounted PCB assembly shown in FIG. 4A, a further pin 402 is a curved pin having one or more straight, curved intermediate and extremity foot portions 436 to provide an electrical connection to a distal edge PEF surface 428A of the PCB 400 that is furthest from the surface 450 of the second PCB 420 to an individual exposed surface contact 440 at the AMF of the PCB 420.

Figure 4B:
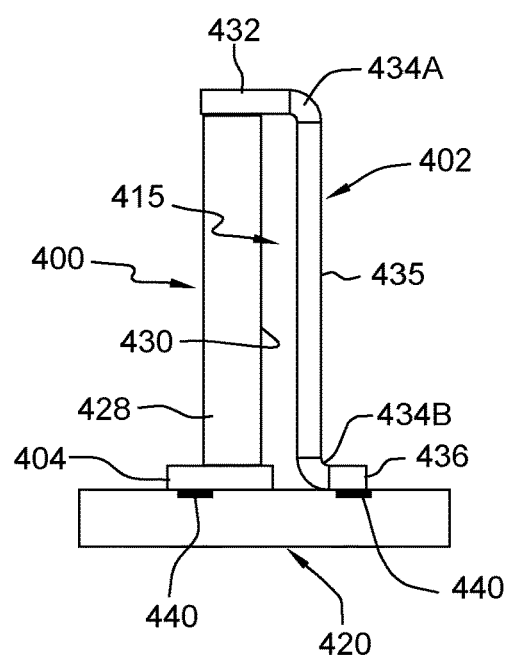

FIG. 4B shows an elevational side view of the mounted PCB structures of FIG. 4A. With respect to the perpendicular orientation of the mounted PCB 400 relative to the second PCB 420, distal PEF edge 428A is an edge furthest from the top surface AMF 450 of the PCB 420. Pin 402 includes a first straight polygonal portion 432 that extends perpendicularly outward from distal PEF edge 428 beyond an AMF surface 430 of the PCB 400. Connected to and extending from first straight portion 432 is a first intermediate curved portion 434A which connects a second elongated straight portion 435 to extend substantially downward for the substantial length of AMF 430 and substantially parallel to the surface AMF 430. Connected to elongated straight portion 435 is a second intermediate curved portion 434B which connects to a foot portion 436 solder attached to a precisely located electrical contact pad 440 at the AMF surface 450 of PCB 420. In other embodiments, the foot portion 436 may be inwardly oriented to further connect with a location on the AMF 430 of the first PCB. The elongated portion of the pin 402 is such that a gap 415 exists between the pin 402 and AMF surface 430 to allow for surface clearance of any device that may be mounted on the AMF 430 of PCB 400. In one embodiment, the radius of curvature of curved portion 434A may be 0.4 mm-1.0 mm (i.e., leaving a gap from tenths of millimeter to whole number millimeters). However, it is understood that the gap distance is a design consideration and may be designed to reduce space. In one embodiment, each of these portions 432, 434A, 435, 434B, 436 may be an integrated unitary structure conductive structure. One or more of the pins 402, 404, 406, 408 may transfer electrical signals, power, or thermal energy to/from and between PCBs 400 and 420 when assembled, or between different locations on the same PCB 400.

In the embodiments herein, during the manufacturing of PCB, the one or more conductive pins are solder attached to the PEF of the PCB, and/or are attached to the AMF of the PCB and/or are attached to devices mounted on the AMF of the PCB, during a same surface mount assembly procedure conducted at the same time other surface mount components are being attached to the AMF of the PCB using well know PCB surface mount assembly. Slight modification to a solder stencil that extends beyond the PEF edge of the PCB may be implemented to ensure solder placement at the PEF.

Figure 5A:
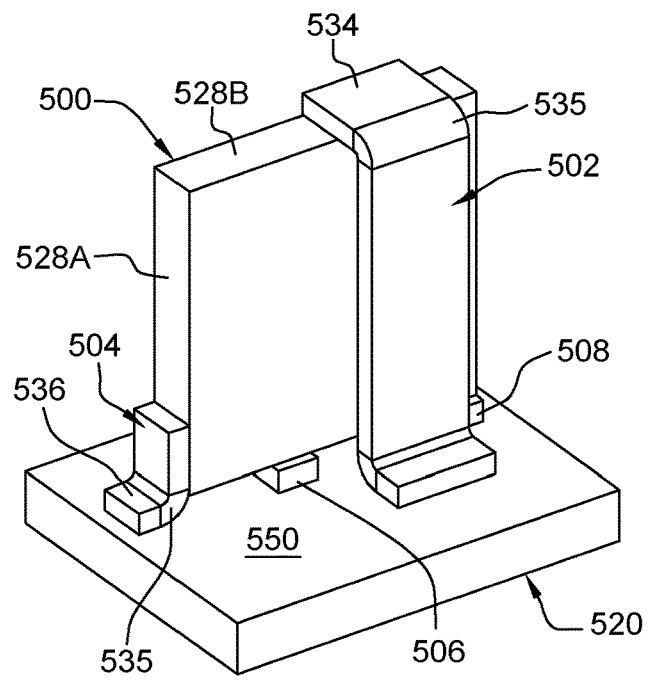
FIGS. 5A and 5B depict a further embodiment of a PCB assembly in which a first PCB is vertically mounted on a surface of a second PCB in a perpendicular orientation relative to the second PCB.
Figure 5B:
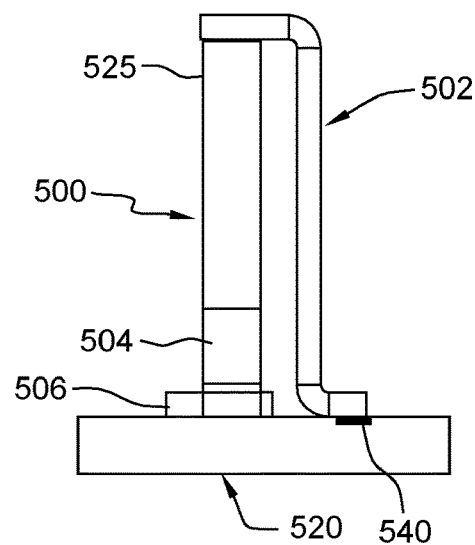

FIGS. 5A and 5B depict a further embodiment of a PCB assembly in which a first PCB 500 is vertically mounted on a surface of a second PCB 520 in a perpendicular orientation relative to the second PCB 520. In the embodiment of FIG. 5, attached conductive pin contacts are solder attached to a conductive contact structure at any PEF as in prior embodiments. In the embodiment shown in FIG. 5A, for example, a curved pin 504 is attached to a sidewall PEF surface 528A, while pins 506 and 508 are solder attached to corresponding contact structures (not shown) at different locations at an underside PEF surface that faces the surface 550 of the second PCB 520 as in prior embodiments. Pins 506 and 508 are straight pins. Pin 502 is attached to a distal PEF surface 528B as shown in the corresponding embodiment depicted in FIGS. 5A and 5B and is configured for conductive connection to a corresponding individual contact pad or connector 540 on an AMF surface 550 of PCB 520. Each of the curved pins 502, 504 includes segmented or unitary straight portions 534, intermediate curved portions 535 and foot extremity portions 536 such that foot portions 536 of each are solder attached to a corresponding contact 540 formed on the AMF surface of second PCB 520 as shown in FIG. 5B.

Figure 6A:
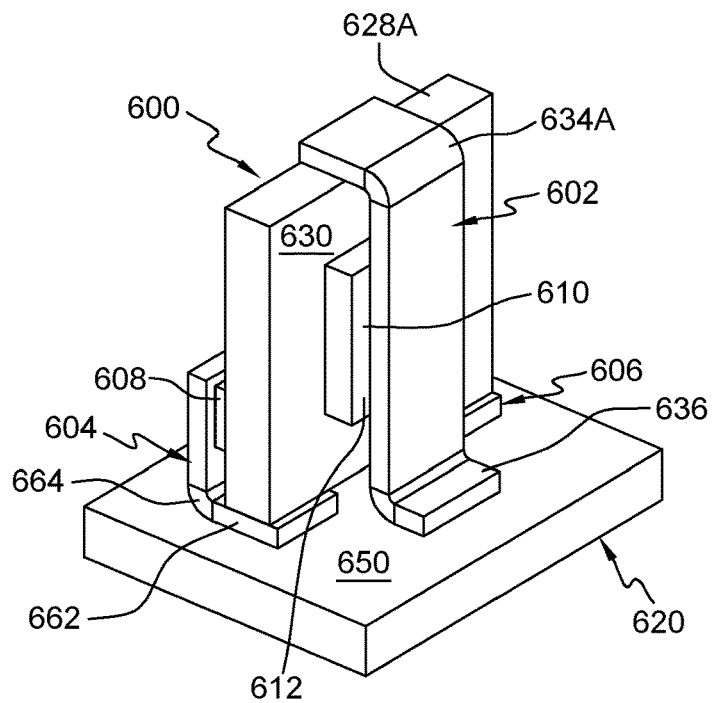
FIGS. 6A and 6B depict a further embodiment of a PCB assembly in which a first PCB is vertically mounted on a surface of a second PCB in a perpendicular orientation relative to the second PCB.
Figure 6B:
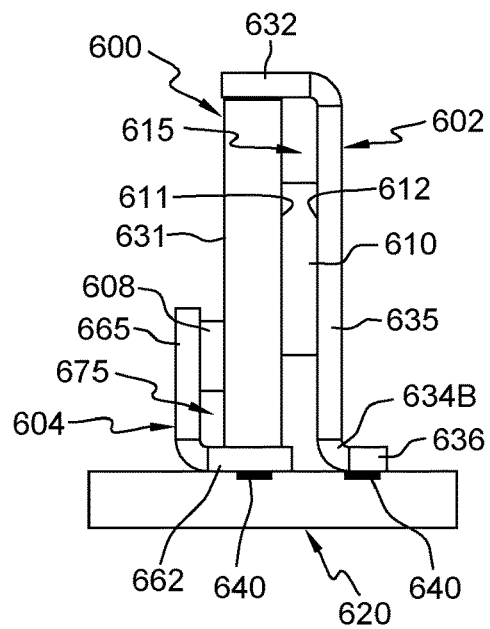

FIGS. 6A and 6B depict a further embodiment of a PCB assembly in which a first PCB 600 is vertically mounted on a surface of a second PCB 620 in a perpendicular orientation relative to the second PCB 620. As shown pins 602, 604 and 606 are solder attached to a corresponding conductive contact 601 at opposing PEF surfaces of the PCB 600. Pin 602 corresponds to the pins 502 and 402 of the prior embodiments having straight and curved portions and having an extremity foot portion 636 solder attached to a corresponding conductive contact or pad 640 formed on the AMF surface of second PCB 620. For example, pin 602 provide an electrical connection to a distal edge PEF surface 628A of the PCB 600 that is furthest from the surface 650 of the second PCB 620 and has corresponding foot portion 636 surface mounted by solder to a conductive contact or pad 640 at the surface 650 of the PCB 620. In particular, pin 602 includes a first straight polygonal portion 632 that extends perpendicularly outward from distal PEF edge 628A beyond an AMF surface 630 of the PCB 600. Connected to and extending from first straight portion 632 is a first intermediate curved portion 634A which connects a second elongated straight portion 635 to extend substantially downward for the substantial length of AMF surface 630 and substantially parallel to the surface AMF 630. Connected to elongated straight portion 635 is a second intermediate curved portion 634B which connects to a foot portion 636 solder attached to a precisely located electrical contact pad 640 at the AMF surface 650 of second PCB 620. The orientation of the extended portion of pin 602 is such that a longitudinal gap 615 results between the attached pin 602 and AMF surface 630 of first PCB 600.

As further shown, in FIGS. 6A-6B are the extendend pin portion of pin 602 conductively, thermally and/or mechanically connected with a surface of a device such as a surface-mounted device(s) 610 mounted on the AMF 630 of circuit board 600. Such devices 610 may include an integrated circuit, an active or passive electronic component, an electrical device or structure, e.g., a magnetic core of a transformer, or mechanical devices and/or other surface mount structures, e.g., heat sink or heat spreader. A layer of connective material (not shown) may be used to connect a surface 612 of surface mounted device 610 to the underside surface of pin 602 to provide a mechanical, thermal or electrical interface between the device and the pin. For example, an underfill material may provide a thermal and mechanical connection between device 610 and pin 602. A solder material may be used to provide a mechanical, electrical and thermal connection between the device and the pin.

In one non-limiting example, PCB 600 may be a power supply and device 610 may be an active heat generating component mounted on an AMF surface 630. In this example, the connected pin 602 may conduct and transfer heat away from board 600 to a heat sink component, e.g., connector or pad 640 on the AMF surface 650 of PCB 620.

As further shown in FIGS. 6A, 6B, the conductive pin 604 includes a first straight polygonal portion 662 that extends perpendicularly from a contact layer (not shown) at the PEF surface of first PCB 600 facing the AMF surface 650 of the second PCB 620. Connected to and extending from first straight portion 662 is a first intermediate curved portion 664 bent upward to connect to an elongated straight portion 665 to extend substantially vertically upward substantially parallel to the back surface AMF 631 thereby creating a longitudinal gap 675 between the attached pin 604 and back AMF surface 631 of first PCB 600.

As further shown, a the vertically extended straight portion 665 of conductive pin 604 is conductively, thermally and/or mechanically connected with a surface of a device 608 such as shown surface-mounted on the AMF 631 of circuit board 600. Such devices 608 may include an integrated circuit, an active or passive electronic component, an electrical device or structure, e.g., a magnetic core of a transformer, or mechanical devices and/or other surface mount structures, e.g., heat sink or heat spreader. A layer of connective material (not shown) may be used to connect a surface of surface mounted device 608 to the underside surface of pin 604 to provide a mechanical, thermal or electrical interface between the device and the pin. For examaple, an underfill material or solder may provide a thermal, electrical and/or mechanical connection between device 610 and pin 602.

In a further example, device 608 may be or include an active heat generating component, while the connected pin 604 may transfer heat away to a heat sink component, e.g., connector or pad 640, on the AMF surface of PCB 620.

The attaching conductive pin structure to PEF surfaces as described herein may be applied to any (e.g., one or more) PEF surfaces of the PCB. By conductive plating of the circuit board PEF surface to contact exposed PCB embedded wire endings brought out to the PEF surface, and by attaching pins to the conductive plating of the circuit board, the attached pins use less space on all layers of a circuit board, while also providing lower contact resistance and better mechanical robustness of the attached PCB to a surface of another PCB to form a mounted assembly. Thus, a first printed circuit board (PCB) has one or more conductive contacts provided on one or more of its Peripheral end faces (PEFs) and one or more conductive pins, wherein one contact section of each pin is solder attached to one or more conductive contacts on a PEF of the first PCB and a second contact section of each pin is solder attached to one or more conductive contacts on a AMF surface of a second PCB of the assembly. The pins are electrically conductive and provide electrical contacts to the PCB assembly. The pins may be thermally conductive and provide thermal contacts to the PCB assembly, or the pins may both be electrically and thermally conductive and provide both electrical and thermal contacts to the PCB assembly.

In one embodiment, each of the first and second PCBs of the assembly provide one or more internal electrical pathways 222 for connecting the solder attached pins to various mechanical and electrical devices of the first and second PCB in addition to the soldered PEF contacts.

Likewise, each of the first and second PCBs of the assembly provide one or more thermal conducting pathways for connecting the solder attached pins to heat generating components on the first or second PCB in addition to the soldered PEF contacts.

While the present invention has been particularly shown and described with respect to preferred embodiments thereof, it will be understood by those skilled in the art that the foregoing and other changes in forms and details may be made without departing from the spirit and scope of the present invention. It is therefore intended that the present invention not be limited to the exact forms and details described and illustrated, but fall within the scope of the appended claims.

What is claimed is:

1. A printed circuit board (PCB) comprising:
   a laminate substrate having multiple layers of a non-conductive substrate material forming top and bottom areal main faces (AMF) and forming at least one peripheral end face (PEF) separating the top and bottom AMFs, the PEF defining a flat surface transverse to the top or bottom AMF;
   conductive wiring at one or more the multiple layers embedded within the substrate, the conductive wiring adapted for carrying electrical or power signals to or from first PCB surface mounted devices, the embedded conductive wiring at the multiple layers includes multiple conductive wire ends exposed at multiple locations along a first PEF surface having a flat surface and along a second opposing PEF having a flat surface of said PCB,
   one or more conductive contact structures formed at the first and opposing second PEF flat surface edges, a conductive contact in contact with one or more of the multiple exposed conductive wire ends along the first PEF flat surface and second opposing PEF flat surface; and
   one or more conductive pins attached to respective one or more conductive contact structures at the first PEF flat surface and at the opposing PEF flat surface, each attached conductive pin comprising:
      a polygonal portion having at least one side planar contact surface, a curved portion and an bottom foot portion providing an extended planar contact surface, said at least one planar contact surface of the polygonal portion attached to the respective conductive contact structure at a PEF and extending in a substantially perpendicular orientation relative to a top or bottom AMF of the PCB,
   said extended planar contact surface of said bottom foot portion of each said conductive pin attached to each said first and second PEF flat surface edges for mounting directly on a corresponding contact formed on an AMF surface of a second PCB to form a PCB assembly in which the PCB is mounted in a substantially parallel orientation relative to said second PCB with increased mechanical stability.

2. The PCB as claimed in claim 1, wherein the one or more conductive pins provide one or more of: an electrical contact, a thermal contact, and mechanical contact for a PCB assembly.

3. The PCB as claimed in claim 2, wherein the conductive contact structure at the PEF surface is a layer of conducting material, the conducting material layer plated onto the PEF prior to assembly of the pin onto the PCB, the plated layer for connecting the conductive pin to one or more of the multiple exposed conductive wire ends.

4. The PCB as claimed in claim 2, wherein the conductive contact structure at the PEF surface is a layer of solder material, the solder material layer formed on the PEF during an assembly of the pin onto the PCB for connecting the attached pin directly to one or more of the multiple exposed conductive wire ends.

5. The PBC as claimed in claim 4, wherein the one or more attached conductive pins make one or more of: thermal, electrical and mechanical contact with a separable mating interface device.

6. The PCB as claimed in claim 4, wherein the one or more attached conductive pins make one or more of: a thermal, electrical and mechanical contact to another location on the PCB or to a device mounted onto the PCB.

7. The PCB as claimed in claim 6, wherein the one or more attached conductive pins make one or more of: a thermal, electrical and mechanical contact to another location on a top or bottom AMF of the PCB, to one or more devices mounted onto a top or bottom AMF of the first PCB, or to both another location on the PCB AMF and to one or more devices mounted onto a top or bottom AMF of the first PCB.

8. The PCB as claimed in claim 4, wherein the one or more attached conductive pins are attached to the PEF of the PCB during a same surface mount assembly procedure when other components are attached to the AMF of the PCB.

9. The PCB as claimed in claim 4, wherein the one or more conductive pins are attached to the PEF of the PCB, to the AMF of the PCB and to devices mounted on the AMF of the PCB, during a same surface mount assembly procedure when other components are attached to the AMF of the PCB.

10. The PCB as claimed in claim 2, wherein the conductive contact structure comprises:
a first layer of a conductive material, the conductive material layer plated onto the PEF prior to assembly of the pin onto the PCB and connecting one or more the multiple exposed conductive wire ends at the PEF surface; and
a second layer of conductive material for attaching the pin to a surface of the first plated layer of conductive material, the pin solder attached to the first layer.

11. The PCB as claimed in claim 1, wherein the curved portion of each said conductive pin connects the polygonal portion to said bottom foot portion, wherein curved portions of one or more conductive pins on an opposing flat PEF surface are oriented such that said planar contact surface of said bottom foot portion is attached to a contact on the AMF surface of said second PCB beneath the PCB when mounted on said second PCB.

12. A printed circuit board assembly comprising:
a first printed circuit board (PCB) having top and bottom areal main faces (AMF) and a peripheral end face (PEF) having a flat surface of predetermined width separating the top and bottom AMF;
a second PCB having at least a top AMF surface;
the first PCB comprising:
a laminate substrate; and
conductive wiring at one or more multiple layers embedded within the substrate, the conductive wiring adapted for connection to various PCB AMF mounted devices, the embedded conductive wiring at the multiple layers includes multiple conductive wire ends exposed at multiple locations along the flat PEF surface;
a conductive contact structure formed at the flat PEF surface and in conductive contact with one or more of the exposed conductive wire ends; and
one or more conductive pins of a polygonal structure having a planar bottom surface and opposing planar contact surfaces, one planar contact surface of the conductive pins attached to the conductive contact structure at the flat PEF surface and a pin extending from the PEF surface in a substantially perpendicular orientation relative to a top or bottom AMF of the first PCB, and
an opposing planar contact surface of each of the one or more the pins of polygonal structure is adapted for surface mounting the PCB on corresponding one or more corresponding conductive contacts formed on an AMF surface of the second PCB to form a PCB assembly, the first PCB mounted in a substantially perpendicular orientation on the AMF surface of the second PCB with the flat PEF surface of the first PCB facing the AMF surface of the second PCB, and wherein the first PCB includes an opposing flat PEF surface, said PCB assembly further comprising:
a conductive contact structure formed at the opposing flat PEF surface of said first PCB;
a solder attached conductive pin connected to a respective conductive contact structure formed at said opposing PEF surface, said attached conductive pin comprising:
a first polygonal structure portion extending outward in a substantially perpendicular orientation relative to the opposing flat PEF surface,
a second polygonal structure portion extending vertically at a right angle relative to the first polygonal portion toward the AMF of the second PCB of the assembly in an orientation parallel to a planar AMF surface of said first PCB, and
a bottom foot portion having an extended planar contact surface for connection directly on a corresponding contact formed on the AMF surface of said second PCB.

13. The PCB assembly as claimed in claim 12, wherein the one or more conductive pins provide an electrical contact, a thermal contact, or both an electrical and thermal contact for the PCB assembly.

14. The PCB assembly as claimed in claim 13, wherein the conductive contact structure at the PEF surface is a layer of conducting material, the conducting material layer plated onto the PEF prior to assembly of the pin onto the PCB, the plated layer for connecting a conductive pin to one or more of the multiple exposed conductive wire ends.

15. The PCB assembly as claimed in claim 13, wherein the conductive contact structure at the PEF surface is a layer of solder material, the solder material layer formed on the PEF during an assembly of the pin onto the PCB for connecting the attached pin directly to one or more of the multiple exposed conductive wire ends.

16. The PCB assembly as claimed in claim 13, wherein the conductive contact structure comprises:
a first layer of a conductive material, the conductive material layer plated onto the PEF prior to assembly of the pin onto the PCB and connecting one or more the multiple exposed conductive wire ends at the PEF surface; and a second layer of conductive material for attaching the pin to a surface of the first plated layer of conductive material, the pin solder attached to the first layer.

17. The PCB assembly as claimed in claim 13, wherein the one or more attached conductive pins make one or more of: a thermal, electrical and mechanical contact to another location on a top or bottom AMF of the PCB, or to an AMF of the second PCB, to one or more devices mounted onto a top or bottom AMF of the first PCB, or contact to both another location on the AMF of the first PCB or an AMF of the second PCB and to one or more devices mounted onto a top or bottom AMF of the first PCB.

18. The PCB assembly as claimed in claim 12, wherein the first PCB further comprises:

a surface mounted device disposed on an AMF of the first PCB, an underside of the extending pin being one of: conductively, thermally and/or mechanically connected with a surface of the mounted device.

19. The PCB assembly as claimed in claim 18, further comprising:

a layer of connective material connects a surface of the surface mounted device to the underside of the extending pin, the connective material layer providing one or more of: an electrical contact, thermal contact, or mechanical contact.

20. The PCB assembly as claimed in claim 12, wherein said a solder attached conductive pin connected to a respective conductive contact structure formed at said opposing flat PEF surface comprises:

a first curved portion connecting said first polygonal structure portion to said vertically extending second polygonal structure portion; and a second curved portion connecting said second polygonal structure portion to said bottom foot portion.

* * * * *